United States Patent [19]

Roth

[11] Patent Number: 4,510,439
[45] Date of Patent: Apr. 9, 1985

[54] DIGITAL CIRCUIT MULTI-TEST SYSTEM WITH AUTOMATIC SETTING OF TEST PULSE LEVELS

[75] Inventor: Rolf Roth, Plochingen, Fed. Rep. of Germany

[73] Assignee: Robert Bosch GmbH, Stuttgart, Fed. Rep. of Germany

[21] Appl. No.: 652,153

[22] Filed: Sep. 18, 1984

Related U.S. Application Data

[63] Continuation of Ser. No. 346,508, Feb. 8, 1982.

[30] Foreign Application Priority Data

Mar. 13, 1981 [DE] Fed. Rep. of Germany ....... 3109711

[51] Int. Cl.³ .................. G01R 31/28; H03K 19/08
[52] U.S. Cl. .................. 324/73 AT; 307/264
[58] Field of Search .................. 324/73 R, 73 AT; 371/15

[56] References Cited

U.S. PATENT DOCUMENTS

| | | | |
|---|---|---|---|
| 3,746,893 | 7/1973 | De Bretagne | 307/552 |
| 3,845,328 | 10/1974 | Hollingsworth | 307/473 |
| 3,946,327 | 3/1976 | Hsu | 330/263 |
| 3,949,242 | 4/1976 | Hirasawa et al. | 307/473 |
| 4,000,412 | 12/1976 | Rosenthal et al. | 307/264 |
| 4,045,691 | 8/1977 | Asano | 307/264 |
| 4,080,539 | 3/1978 | Stewart | 307/264 |
| 4,293,782 | 10/1981 | Tanaka et al. | 307/350 |
| 4,309,701 | 1/1982 | Nishimura | 307/296 R |
| 4,321,491 | 3/1982 | Atherton et al. | 307/475 |
| 4,379,264 | 4/1983 | Lenhardt | 307/512 |

OTHER PUBLICATIONS

Holt, "Electronic Circuits: Digital and Analog", 1978, John Wiley & Sons, New York, pp. 784–786.

Primary Examiner—Stanley D. Miller
Assistant Examiner—Timothy P. Callahan
Attorney, Agent, or Firm—Frishauf, Holtz, Goodman & Woodward

[57] ABSTRACT

A pair of complementary VMOS transistors connected in push-pull is utilized to convert pulses supplied to the gates of these transistors into two-level output signals of which each of the voltage levels is independently adjustable. A digital-to-analog converter is connected to each of the VMOS transistor channels inputs, so that the two voltage levels in question can be set and changed by digital input to the converters provided by a microprocessor. Controlling the d.c. levels of output pulses by a microprocessor makes possible the testing of electronic circuits utilizing different kinds of electronic logic with a single test unit. The selection of the voltage levels of the output pulses to match the type of logic of the circuits to which the pulses are applied can be made through the microprocessor in response to a signal representative of the supply voltage of the circuits under test.

2 Claims, 3 Drawing Figures

DIGITAL CIRCUIT MULTI-TEST SYSTEM WITH AUTOMATIC SETTING OF TEST PULSE LEVELS

This application is a continuation of application Ser. No. 346,508, filed Feb. 8, 1982.

This invention concerns apparatus for changing the upper and lower voltage levels of digital signals in which the upper and lower signal levels are independently selectable, in particular, apparatus utilizing a push-pull transistor pair stage for providing the desired levels in the output signals of the stage. The apparatus may be used for the transmission of digital signals or for testing digital electronic circuits of various kinds.

D.c. level converting circuits utilizing a push-pull transistor output stage are in general known. The known circuits of this type have the disadvantage, however, that the d.c. level values are wired in and accordingly are not variable. It is common for different kinds of electronic digital circuit technology to be incorporated in the same equipment, so that converters designed to convert signals to outputs utilizing certain voltage levels, would have to be duplicated for each type of circuit technology when the different circuit technologies utilize different logic levels.

Published German patent application DE-OS 30 28 871, however, discloses a level converter with adjustable level values, but the disclosed circuit has the disadvantage that the setting of the lower and higher voltage levels is produced by reference to a fixed difference voltage. This arrangement is expensive for use with equipment involving a variety of circuit technologies, since supplementary equipmemt would be necessary for utilization because the upper and lower voltage levels are not separately adjustable. If one voltage level is prescribed, the second is automatically provided by addition or subtraction of the difference voltage. This complication means that further expense in additional circuits would be necessary to provide two separately adjustable levels and if the particular levels are to be selected under the command of a microprocessor, more expensive software becomes involved.

THE INVENTION

It is an object of the present invention to provide a level converter circuit in which an upper voltage level and a lower voltage level in the output are each independently determinable and, in particular, such a circuit in which the upper and lower voltage levels are independently selectable under the control of a microprocessor.

Briefly, a pair of controllably pairable d.c. voltage sources is provided, these voltage sources having their outputs respectively connected to the switching paths of the two transistors operating in push-pull. The other ends of the two switching paths are connected together and also to an output circuit into which the transistors are caused to provide the desired voltage levels in alternation in response to an input voltage wave applied to their control terminals. The d.c. voltage sources are preferably digital-to-analog converters, and the transistor pair is preferably a pair of complementary conduction type VMOS transistors.

The circuit of the invention has the advantage that both output voltage levels can be adjusted or set independently of each other and that the transistors have short switching times, so that a high switching frequency is obtainable.

When the d.c. voltage sources are digital-to-analog converters, the output voltage of these sources can be controlled by digital signals, so that the levels may be selected by a multi-position rotary selector switch, an array of button switches, or by a microprocessor executing its program.

In the latter case, it is possible to operate the level converter under external selection dependent upon the circuit technology to which the output is supplied in response to the supply voltage, for example, provided to the particular circuit technology.

VMOS transistors have the advantage of very fast switching and absence of storage effects, so that extremely high switching frequencies can be obtained, along with steep pulse flanks. Furthermore, the gate of a VMOS transistor is insulated from the channel (these transistors are a kind of so-called field effect transistor), so that lossless control is possible. The circuit apparatus of the invention is particularly well suited for test equipment for digital circuits in which are present subcircuits utilizing different kinds of technology such as, for example, TTL, CMOS and ECL circuits. These are generally operated at different supply voltages characteristics of the particular technology, so that it is possible to control the d.c. voltage sources of the level converter by selection in accordance with the supply voltage of the circuits being tested.

THE DRAWINGS

The invention is further described by way of illustrative example with reference to the annexed drawings, in which.

DESCRIPTION OF THE ILLUSTRATED EMBODIMENT

Figure 1:
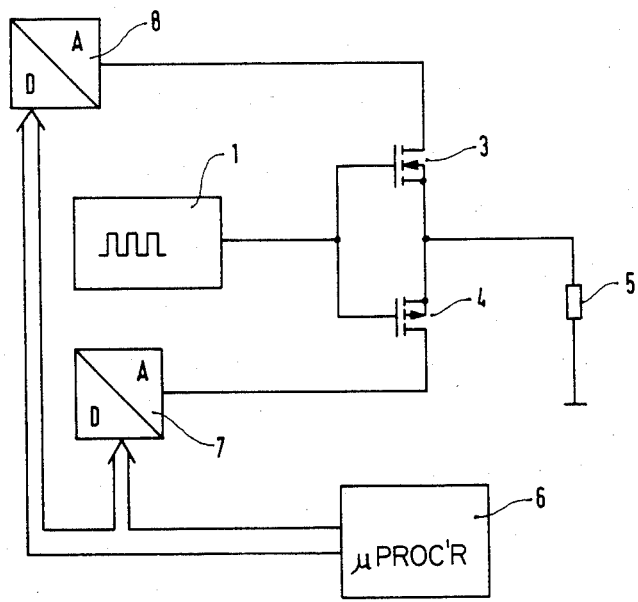
FIG. 1 is a circuit diagram, partly in block form, of a circuit of the invention utilizing digital-to-analog converters as d.c. voltage sources.

FIG. 1 shows a square wave generator 1 that supplies an output to both of the respective gates of the VMOS transistors 3 and 4. A channel output of VMOS transistor 3 and a channel output of VMOS transistor 4 are connected together and connected also to a load resistance 5, the other side of which is connected to the common ground or chassis bus.

A microprocessor 6 is connected to a data bus that connects with the respective digital-to-analog converters 7 and 8. The output of the digital to analog converter 7 is connected to the channel input of a VMOS transistor 4, while the output of the digital-to-analog converter 8 is connected to a channel input of the VMOS transistor 3.

The circuit shown in FIG. 1 is designed to serve as a test circuit for digital electronic circuits. If the circuit were to be used as a general purpose d.c. level changer, instead of the square wave generator 1 the output signal of a digital circuit which is to be subjected to level changing is connected to the gates of the VMOS transistors.

In the circuit shown the square wave generator 1 has its output connected the gates of the VMOS transistors 3 and 4, which are of complementary conductivity type and operate in push-pull. When the square wave generator provides a positive output voltage, the VMOS transistor 3 is conducting and the VMOS transistor 4 is blocked, whereas the transistor 4 is conducting and the transistor 3 is blocked when the square wave generator is delivering a negative voltage value. The load resistance 5 represents the loading of the push-pull output stage of the circuit shown by the assembly to which this output is supplied. Voltage pulse groups appear across the load resistance 5, such as are shown, for example, in FIG. 2. The upper voltage value of the pulse is determined by the d.c. voltage which is supplied by the digital-to-analog converter 8. The lower voltage level is determined by the d.c. voltage which is provided by the digital-to-analog converter 7. Each voltage level corresponds to a digital word that is provided by the microprocessor 6 to the particular digital-to-analog converter over the data bus.

When VMOS transistors are used in the push-pull stage, as shown in FIG. 1, the respective d.c. output voltages of the digital-to-analog converters 7 and 8 can take on positive as well as negative voltage values, since the channel of the VMOS transistors 3 and 4 is controlled by voltage applied to the gate and the gate is insulated from the channel. By a corresponding programming of the microprocessor the result can be obtained that when electrical subassemblies or subcircuits are connected for testing, the proper voltage levels to be provided by the push-pull output stage of the voltage level setting circuit can automatically selected, either in response to the control command which identifies the circuit that is to be connected or in response to the recognition of the value of the operating voltage of the particular circuit.

In a simpler embodiment of the invention it is possible to replace the digital-to-analog converters by potentiometers energized by a d.c. voltage source, so that the arms of the potentiometers may be adjusted to select the desired d.c. level values. It is also possible to connected the digital input of the digital-to-analog converters 7 and 8 with suitable switches applying voltages to each bit input for selecting the desired level values digitally.

Any kind of transistors of suitable power rating may be used for the push-pull circuit shown for the transistors 3 and 4, but the use of VMOS transistors has the advantage that very short switching times are obtainable and no storage effect appears, so that high switching frequencies can be obtained, while the gate is insulated from the channel so that positive and negative d.c. voltages can be applied.

Figure 2:
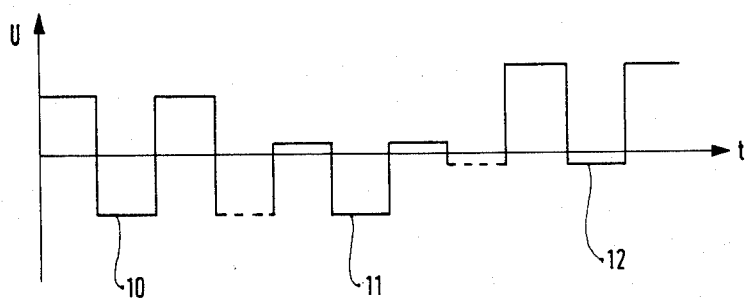
FIG. 2 is a time-base graph showing different types of pulses that may be produced by the circuit of FIG. 1 with changes of the d.c. levels set into the converter.

FIG. 2 shows three pulse groups 10, 11 and 12 which can be produced by means of the level converter. The pulse group 10 is obtained when the digital-to-analog converters 7 and 8 provide voltages of opposite sign and approximately the same absolute magnitude. The pulse group 11 appears when only a small positive voltage is provided by the digital-to-analog converter 8, while the digital-to-analog converter 7 provides the same negative voltage as in the case of pulse group 10. Pulse group 12 is produced when the digital-to-analog converter 7 provides only a slight negative voltage, while the digital-to-analog converter 8 provides a large positive voltage.

Figure 3:
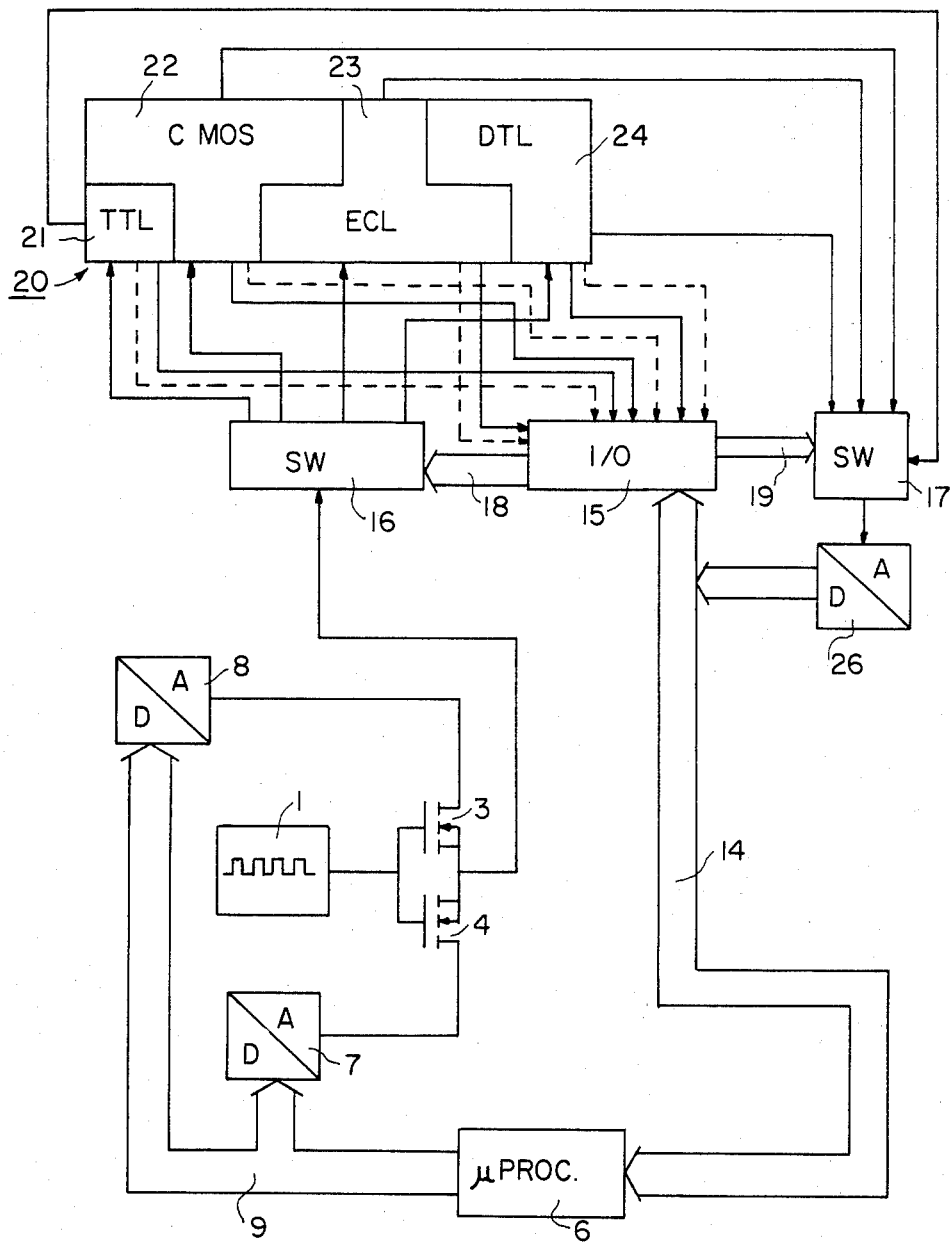
FIG. 3 is a block diagram of a circuit of the invention used for testing an electronic equipment with automatic selection of the d.c. test signal levels in accordance with the supply voltage of the particular circuits being tested.

FIG. 3 illustrates a typical connection of the circuit of FIG. 1. for testing digital circuits of electronic equipment. FIG. 3 merely substitutes for the resistance 5 the equipment to be tested and certain input/output apparatus of the test circuit not shown in FIG. 1.

The entire circuit of FIG. 1 except for the resistance 5 is recognizable in FIG. 3 and need not be described further. The data bus 9 is the data bus shown in FIG. 1. A two-way data bus 14 is also provided to connect the microprocessor 6 to an input/output device 15 which controls the switches 16 and 17. These are selector switches which in practice would be made up of individual switches for each selection selectively operated by the input/output circuit 15 through wire represented by the data busses 18 and 19. The output of the push-pull transistor stage 3,4, provides the signal input to the switch 16 which supplies the square wave test signals to whichever one of the four portions 21, 22, 23 and 24 of the electronic equipment 20 which is under test may be selected by the microprocessor 6 in accordance with its program through the input/output device 15. These four portions are shown in FIG. 3 with legends indicating different types of electronic logic circuits, requiring different d.c. levels for testing. As the test signals are applied to the appropriate circuit, response signals go back to the input/output unit 15 for transmission to the microprocessor 6 over the data bus 14 for evaluation. The keyboard control, evaluation circuits, displays and memories usually associated with a microprocessor are not shown in FIG. 3 for reasons of simplifying the drawing. The signals to be evaulated are shown in FIG. 3 as going in each case over two connections, one shown in a solid line and another in a dashed line, but of course there may be more connections if there are different parts of the circuits that need to be tested, whereas it is also possible that a single connection for the circuit response would be sufficient, depending upon the kind of tests to be applied to the various circuits. The respective supply voltages of the circuit portions 21, 22, 23 and 24 are furnished by connections leading to the switch 17, which is operated by the input/output device 15 so as to present to the digital-to-analog converter 26 the supply voltage of the particular circuit portion that is under test. That voltage is then converted to a digital signal for transmission over the bus 14 to the microprocessor 6, which then provides the appropriate signals over the bus 9 for setting the levels of d.c. output provided by the digital-to-anal ocnverters 7 and 8.

Of course if only certain simple tests are to be made or if the behavior of the various circuits is to be observed by an operator on an oscilloscope or other visual display, a simpler test circuit can be used, for example, eliminating the microprocessor 6, substituting a rotary switch assembly for the input/output device 15 and the switches 16 and 17 and connecting the output of the digital-to-analog converter 26 to the inputs of the digital-to-analog converters 7 and 8 respectively through simple digital translators such as may be provided in each case by a read-only memory (ROM).

Thus, although the invention has been illustrated by particular embodiments, it will be evident that variations and modifications are possible within the inventive concept.

I claim:

1. Apparatus for testing electronic equipment by a sequence of tests respectively requiring the presence of d.c. supply voltages subject to variation from test to test in d.c. supply voltage value requirement, and having a test signal pulse generator automatically adaptable to said d.c. supply voltage value requirement, said apparatus comprising:
- a microprocessor (6) associated with an input/output unit having input connections for receiving signals from electronic equipment under test for evaluation thereof under control of said microprocessor (6);
- first (16) and second (17) controllable switch units connected to said input/output unit (15) for control thereof by said microprocessor (6) said first switch unit (16) being connected for selective supply of switched test signals to said electronic equipment and said second switch unit (17) being connected for selective pick-up of d.c. supply voltage levels from portions of said equipment to be tested;
- an analog-to digital converter (26) connected to said second switch unit (17) and to said microprocessor (6) for furnishing to said microprocessor (6), in digital form, d.c. supply voltage levels selectively picked up by said second switch unit (17);
- a pulse generator (1) and a limit-level-controllable output stage therefor for supplying test pulses to said first switch unit (16) for selective application of said test pulses to said electronic equipment under test, said limit-level-controllable output stage comprising a push-pull transistor-pair (3,4) stage having their respective control electrodes connected to said pulse generator and having their switchedpath electrodes connected for alternate switching on of said transistors by operation of said generator;
- a first digital-to-analog converter connected to said microprocessor and connected for applying a first d.c. voltage of a magnitude controlled by said microprocessor to a first switching path electrode of a first transistor of said transistor-pair stage, and
- a second digital-to-analog converter connected to said microprocessor and connected for applying a second d.c. voltage of a magnitude controlled by said microprocessor to a first switching path electrode of the second transistor of said transistor-pair stage,
- said transistors each having a second switching path electrode, said second switching path electrodes of the respective transistors being connected to each other and also to said first switching unit (16) for supplying test pulses thereto in the form of pulse-like alternating transitions between voltages controlled by said microprocessor (6) through said first and second digital-to-analog converters.

2. Apparatus as defined in claim 1 in which said transistors (3,4) are a pair of complementary-type VMOS transistors.

* * * * *